(12) United States Patent
Peng et al.

(10) Patent No.: US 7,515,423 B2
(45) Date of Patent: Apr. 7, 2009

(54) HEAT DISSIPATION DEVICE

(75) Inventors: Xue-Wen Peng, Shenzhen (CN); Bing Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 303 days.

(21) Appl. No.: 11/309,759

(22) Filed: Sep. 22, 2006

(65) Prior Publication Data

US 2008/0074846 A1 Mar. 27, 2008

(51) Int. Cl.
*H05K 7/20* (2006.01)
*H01R 13/00* (2006.01)

(52) U.S. Cl. .......... 361/710; 361/701; 361/704; 361/714; 361/715; 165/80.3; 165/80.4; 165/104.21; 165/104.33; 165/185; 257/715; 307/146; 307/147

(58) Field of Classification Search ......... 361/699–709, 361/710–719, 836; 165/80.2, 80.3, 80.4, 165/104.21, 104.33, 104.34, 185; 257/706–727; 307/144, 145, 146, 147; 174/15.2, 15.3, 174/50

See application file for complete search history.

(56) References Cited

U.S. PATENT DOCUMENTS

| | | | | |
|---|---|---|---|---|
| 5,019,767 A | * | 5/1991 | Shirai et al. | 320/112 |
| 5,726,858 A | * | 3/1998 | Smith et al. | 361/705 |
| 6,081,425 A | * | 6/2000 | Cheng | 361/704 |
| 6,209,631 B1 | * | 4/2001 | Garcia-Ortiz | 165/287 |
| 6,724,631 B2 | * | 4/2004 | Ye et al. | 361/719 |
| 6,937,474 B2 | * | 8/2005 | Lee | 361/715 |
| 6,977,815 B2 | * | 12/2005 | Hsu | 361/704 |
| 7,019,974 B2 | * | 3/2006 | Lee et al. | 361/700 |
| 7,081,686 B2 | * | 7/2006 | Yang | 290/1 R |
| 7,209,356 B2 | * | 4/2007 | Lee et al. | 361/719 |
| 7,274,569 B2 | * | 9/2007 | Sonoda | 361/714 |
| 7,300,302 B2 | * | 11/2007 | Kajiwara et al. | 439/485 |

FOREIGN PATENT DOCUMENTS

JP 2000165072 A * 6/2000

* cited by examiner

*Primary Examiner*—Michael V Datskovskiy
(74) *Attorney, Agent, or Firm*—Jeffrey T. Knapp

(57) ABSTRACT

A heat dissipation device cooling a power adapter (50) includes first and second heat dissipation units (10), (20), at least one heat pipe (30) connecting the first and second heat dissipation units and a plurality of positioning elements (60) securing the first and second heat dissipation units on the power adapter. The positioning elements extend through the first heat dissipation unit and bottom ends of the positioning elements are screwed into the second heat dissipation unit. Top ends of the positioning elements are secured to the first heat dissipation unit. Therefore, the power adapter is tightly sandwiched between the first heat dissipation unit and the second heat dissipation unit by the positioning elements. Spring forces are exerted by the positioning elements on the first heat dissipation unit toward the second heat dissipation unit.

16 Claims, 5 Drawing Sheets

HEAT DISSIPATION DEVICE

FIELD OF THE INVENTION

The present invention generally relates to a heat dissipation device for removing heat from a power adapter which is often used for computers or notebook PCs.

DESCRIPTION OF RELATED ART

With the continuing advance of computer technology, electronic components such as central processing units (CPUs) of computers are being made to provide faster operational speeds and greater functional capabilities. When a CPU operates at a high speed in a computer, a power adapter must provide a large amount of power to the CPU. As working capacity of the power adapter gradually increases, a temperature of the power adapter is increased accordingly. It is therefore desirable to dissipate the heat of the power adapter quickly, for example by using a heat dissipation device attached to the power adapter.

However, the power adapter usually has a smaller volume and occupies a small space. It therefore demands that the heat dissipation device for the power adapter also occupies a small space. Thus, a heat dissipation device with a compact structure so as to occupy a small space is needed.

SUMMARY OF THE INVENTION

A heat dissipation device for cooling a power adapter in accordance with a preferred embodiment of the present invention includes first and second heat dissipation units, at least one heat pipe connecting the first and second heat dissipation units and a plurality of positioning elements securing the first and second heat dissipation units on the power adapter. The positioning elements are extended through the first heat dissipation unit, screwed to the second heat dissipation unit and secured to the first heat dissipation unit, whereby the power adapter is tightly sandwiched between the first heat dissipation unit and the second heat dissipation unit by the positioning elements.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
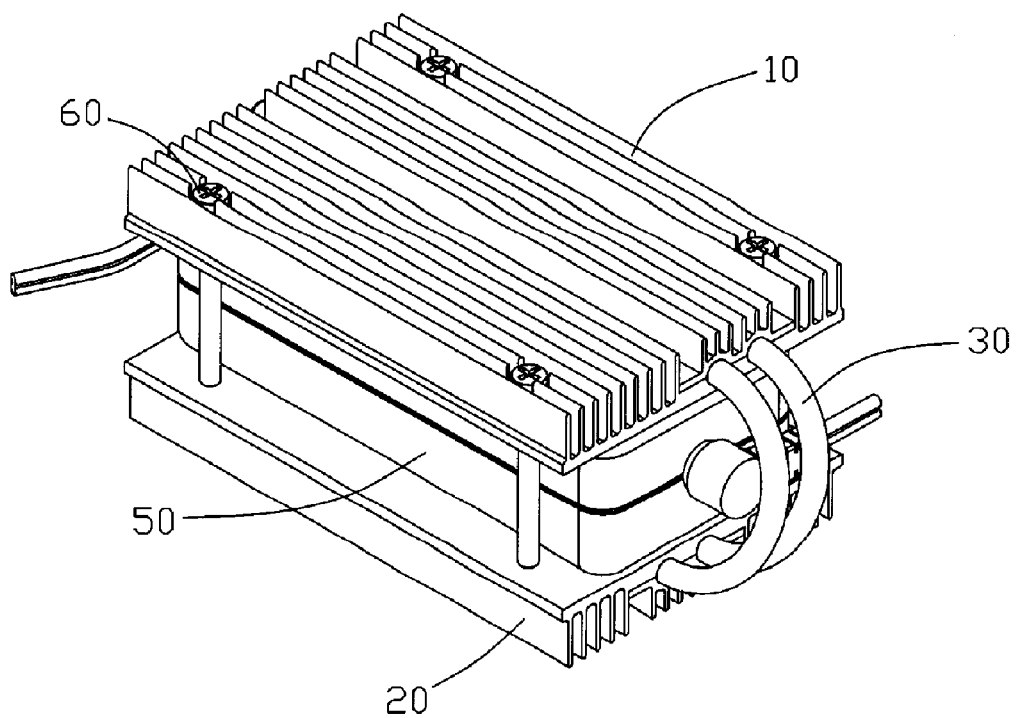
FIG. 1 is an assembled, isometric view of a heat dissipation device in accordance with a preferred embodiment of the present invention, together with a power adapter.

Referring to FIG. 1, a heat dissipation device in accordance with a preferred embodiment of the present invention comprises a first heat dissipation unit 10, a second heat dissipation unit 20, a pair of heat pipes 30 thermally connecting the first and second heat dissipation units 10, 20 and four positioning elements 60 securing the first and second heat dissipation units 10, 20 on a power adapter 50. The positioning elements 60 are extended through the first heat dissipation unit 10 and screwed in the second heat dissipation unit 20, whereby the power adapter 50 is tightly sandwiched between the first heat dissipation unit 10 and the second heat dissipation unit 20 by the positioning elements 60. The heat dissipation device is used to remove heat from the power adapter 50 used for a computer or a notebook PC.

Figure 2:
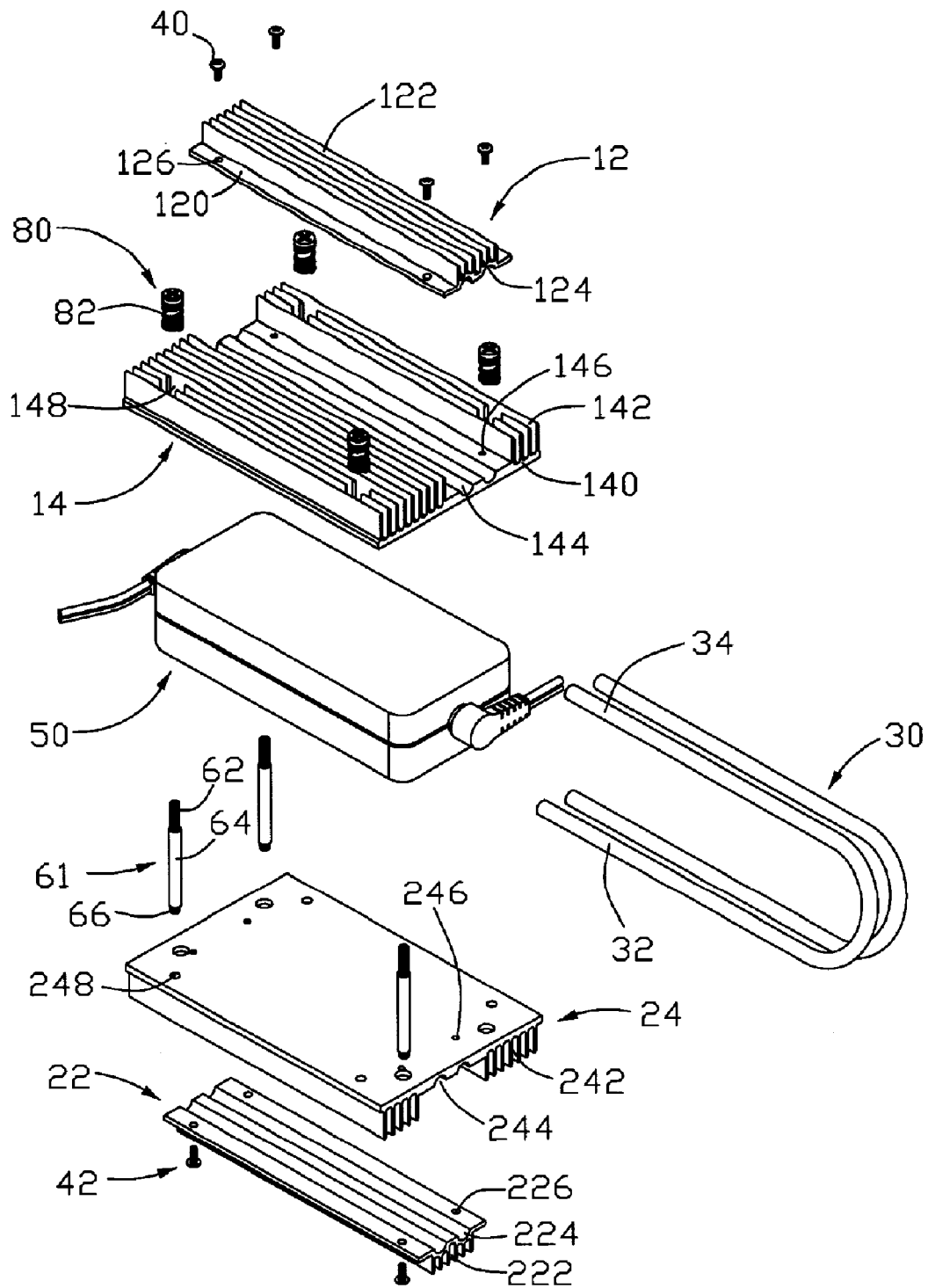
FIG. 2 is an exploded view of FIG. 1.

Particularly referring to FIG. 2, the first heat dissipation unit 10 comprises a first heat-dissipation portion 12 and a second heat-dissipation portion 14 securable to the first heat-dissipation portion 12. The first heat-dissipation portion 12 comprises a base 120 and a plurality of fins 122 projecting perpendicularly therefrom, for facilitating heat dissipation. The first heat-dissipation portion 12 defines a pair of first grooves 124 in a bottom of the base 120 opposite to the fins 122, and four through holes 126 in the base 120. The four through holes 126 are arranged at four corners of the base 120. The first grooves 124 are parallel to each other and disposed between the through holes 126.

The second heat-dissipation portion 14 is used for attaching on the power adapter 50 so that heat generated by the power adapter 50 is absorbed by the second heat-dissipation portion 14. The second heat-dissipation portion 14 comprises a plate 140 and a plurality of fins 142 extending perpendicularly from a top surface of the plate 140. The plate 140 comprises an un-finned portion (not labeled) in the middle thereof and defines a pair of parallel second grooves 144 in the un-finned portion (not labeled) of the top surface of the plate 140. The second grooves 144 are arranged corresponding to the first grooves 124 of the first heat-dissipation portion 12 to form a pair of first passages (not labeled) for partly accommodating the heat pipes 30. Four screw holes 146 are defined in four corners of the un-finned portion of the plate 140, at positions corresponding to those of the through holes 126 of the first heat-dissipation portion 12 respectively. Four bores 148 are defined in four corners of the second heat-dissipation portion 14 and extend through the fins 142. Four screws 40 are used to extend through the through holes 126 of the first heat-dissipation portion 12 and screwed into the screw holes 146 of the second heat-dissipation portion 14, so that the bottom of the base 120 of the first heat-dissipation portion 12 is attached onto the un-finned portion of the second heat-dissipation portion 14 and the fins 142 of the second heat-dissipation portion 14 are juxtaposed with the fins 122 of the first heat-dissipation portion 12.

The second heat dissipation unit 20 comprises a first heat-dissipation portion 22 and a second heat-dissipation portion 24. The first heat-dissipation portion 22 comprises a plurality of fins 222 extending perpendicularly downwardly therefrom and defines a pair of first slots 224 in a top thereof opposite to the fins 222, and four through holes 226 beside the first slots 224. The four through holes 226 are arranged at four corners of the first heat-dissipation portion 22. The first slots 224 are parallel to each other and disposed between the screw holes 226. The second heat-dissipation portion 24 comprises a plurality of fins 242 extending perpendicularly therefrom, and defines a pair of parallel second slots 244 in an un-finned portion (not labeled) of a bottom thereof, corresponding to the first slots 224 to form a pair of second passages (not labeled) for partly accommodating the heat pipes 30. Four screw holes 246 are defined at four corners of the un-finned portion of the second heat-dissipation portion 24, positioned corresponding to the four through holes 226 of the first heat-dissipation portion 22 respectively. Four round recesses 248 are arranged at four corners of a top of the second heat-dissipation portion 24 corresponding to the bores 148 of the second heat-dissipation portion 14 of the first heat dissipation unit 10. Each round recess 248 has a diameter smaller than that of the bore 148 and defines screw threads (not shown) around its inner wall. Four screws 42 are used to extend through the through holes 226 of the first heat-dissipation portion 22 and screw into the screw holes 246 of the second heat-dissipation portion 24, so that the top of the first heat-dissipation portion 22 is attached on the un-finned portion (not labeled) of the second heat-dissipation portion 24 and the fins 242 of the second heat-dissipation portion 24 are juxtaposed with the fins 222 of the first heat-dissipation portion 22.

The four positioning elements 60 each comprises a post 61 and a nut 80 engaging with the post 61. The nut 80 is wrapped with a spring 82 therearound. The post 61 comprises a first segment 62 defining screw threads (not labeled) in a circumference of a top thereof, a second segment 64 and a third segment 66 defining screw threads (not labeled) in a circumference of a bottom thereof. The first segment 62 and third segment 66 each has a diameter smaller than that of the second segment 64.

Each heat pipe 30 is U-shaped and comprises an evaporating segment 32 received in the second passage cooperatively defined by the first and second slots 224, 244, and a condensing segment 34 received in the first passage cooperatively defined by the first and second grooves 124, 144. Thermal conduct media, such as thermal grease is applied on outer surfaces of the evaporating segments 32 and the condensing segments 34 of the heat pipes 30 to enhance heat-transfer between the heat pipes 30 and the first and second heat dissipation units 10, 20. Alternatively, it is feasible that free ends of the heat pipes 30 can be pressed to have a flat configuration to prevent the heat pipes 30 from moving out of the heat dissipation units 10, 20 after the second heat-dissipation portion 14 and second heat-dissipation portion 24 are respectively assembled to the first heat-dissipation portion 12 and the first heat-dissipation portion 22 to sandwich the evaporating and condensing segments 32, 34 of the heat pips 30 therebetween. The heat pipes 30 are moveably arranged in the first and second heat dissipation units 10, 20 before the positioning elements 60 secure the first and second heat dissipation units 10, 20 on the power adapter 50.

Figure 3:
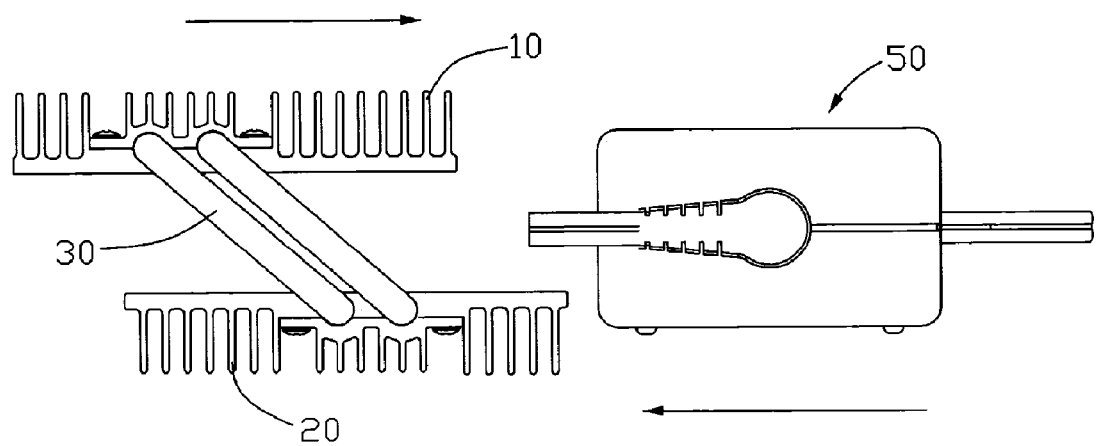
FIG. 3 and FIG. 4 are side views showing the process of installing first and second heat dissipation units of the heat dissipation device to the power adapter.
Figure 4:
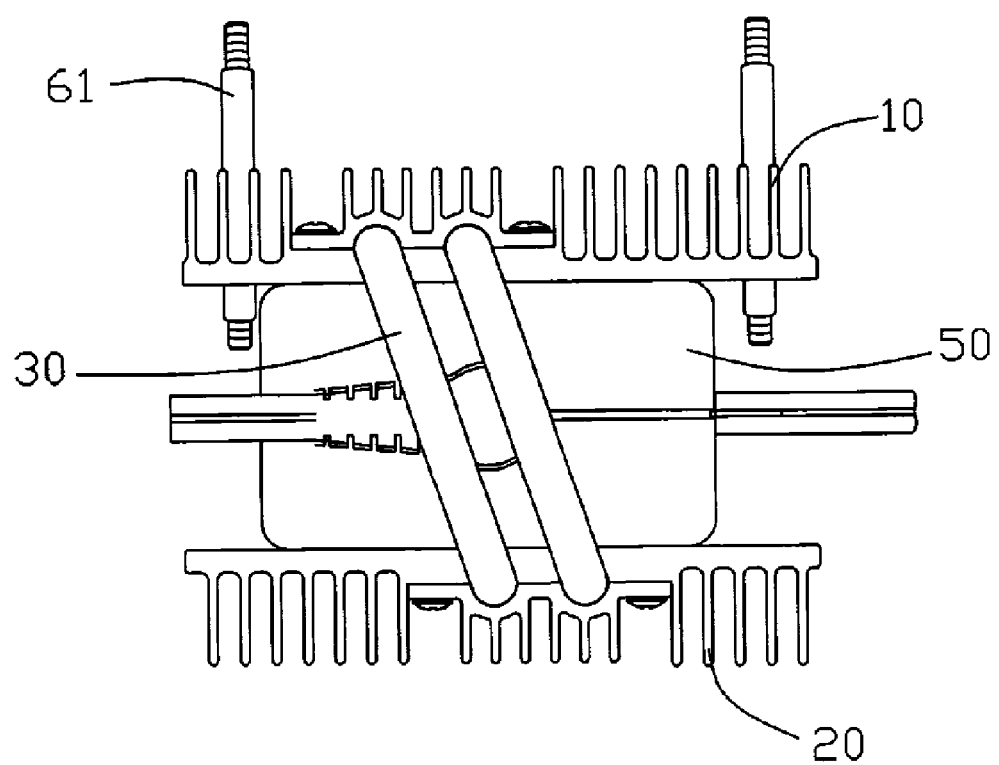
Figure 5:
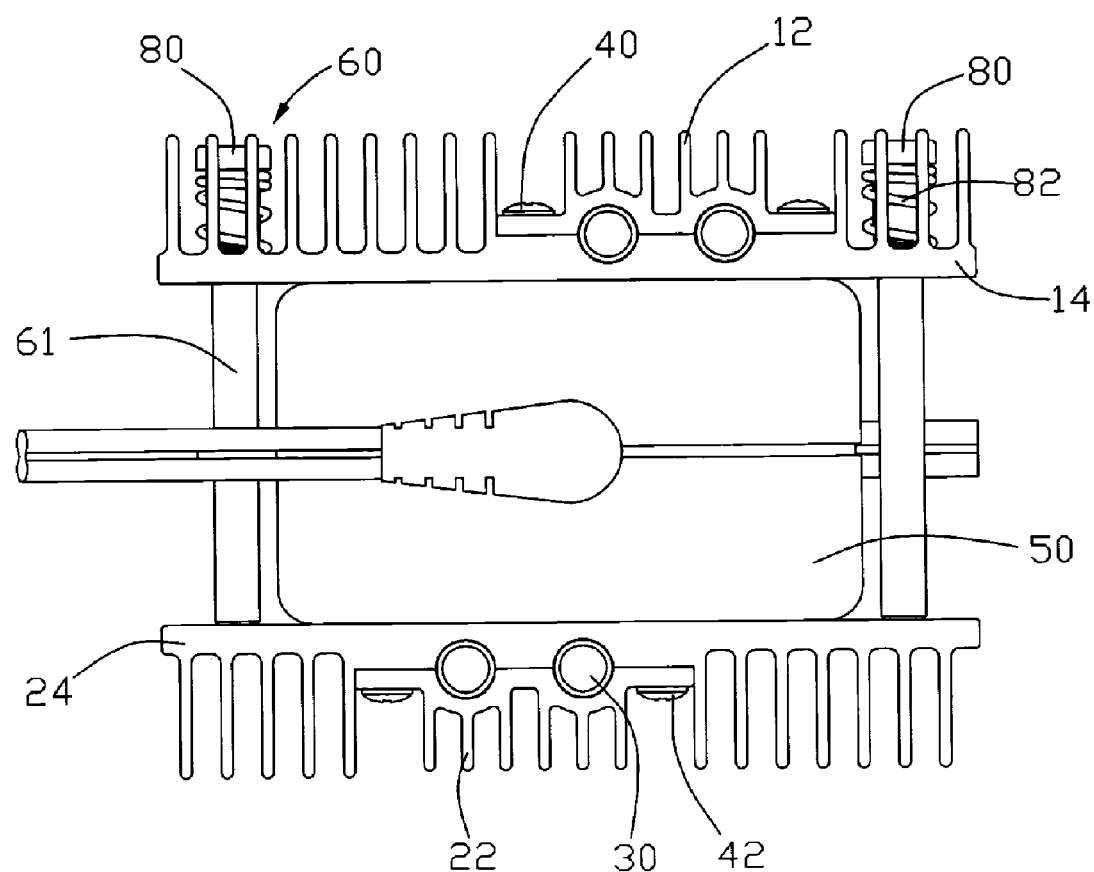
FIG. 5 is a side view of FIG. 1.

Referring particularly to FIGS. 3-5 together, during an installation of the power adapter 50 to the first and second heat dissipation units 10, 20, the first and second heat dissipation units 10, 20 are separated from each other a certain distance so that the power adapter 50 can be easily interposed between the first and second heat dissipation units 10, 20. As the heat pipes 30 which are movably retained in the first and second heat dissipation units 10, 20 are rotated in respective to the first and second heat dissipation units 10, 20, and the first heat dissipation unit 10 is moved in a direction as shown by an arrow of FIG. 3, the distance between the first heat dissipation unit 10 and the second heat dissipation unit 20 is increased whereby the power adapter 50 can be accommodated between the first and second heat dissipation units 10, 20 as shown in FIG. 4. When the first and second heat dissipation units 10, 20 are attached on top and bottom surfaces of the power adapter 50, the posts 61 are brought to extend through the bores 148 in the second heat-dissipation portion 14 of the first heat dissipation unit 10.

Referring particularly to FIGS. 2 and 5, the third segments 66 of the posts 61 are firstly brought to extend through the bores 148 of the first heat dissipation unit 10 until they are screwed into the recesses 248 of the second heat-dissipation portion 24 of the second heat dissipation unit 20. The nuts 80 are then brought to screw with the first segments 62 of the posts 61 in the bores 148 until the nuts 80 are secured in the bores 148. When the nuts 80 reach their final screwed positions, the springs 82 wrapped around the nuts 80 are compressed to press the first heat dissipation unit 10 toward the power adapter 50 and the second heat dissipation unit 20, whereby the first and second heat dissipation units 10, 20 are tightly attached on the top and bottom surfaces of the power adapter 50.

In operation of the heat dissipation device, heat absorbed by the second heat dissipation unit 20 from the bottom surface of the power adapter 50 has a part dissipated to atmosphere by the fins 222, 242 of the second heat dissipation unit 20, and a part transmitted to the first heat dissipation unit 10 through the heat pipes 30, which is dissipated to atmosphere via the fins 122, 142 of the first heat dissipation unit 10.

According to the preferred embodiment, the heat dissipation device with the power adapter 50 sandwiched between the first and second heat dissipation units 10, 20 has a compact structure. This is quite advantageous in view of packaging and transportation of the heat dissipation device since there is no too many trivial components needed to be packed and transported, and the assembly of the heat dissipation device is very simple.

Alternatively, it is feasible that an electric fan is arranged on one of the first and second heat dissipation units 10, 20 to enhance heat dissipation of the heat dissipation device.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device cooling a power adapter, comprising:
    a first heat dissipation unit attached on a side of the power adapter;
    a second heat dissipation unit attached on an opposite side of the power adapter;
    at least one heat pipe thermally and mechanically connecting the first and second heat dissipation units;
    positioning elements securing the first and second heat dissipation units on the power adapter;
    wherein the positioning elements are extended through the first heat dissipation unit and secured to the second heat dissipation unit and first heat dissipation unit and wherein the power adapter is tightly sandwiched between the first heat dissipation unit and the second heat dissipation unit by the positioning elements wherein the first heat dissipation unit comprises first and second heat-dissipation portions and the at least one heat pipe is partly sandwiched between the first heat-dissipation portion and the second heat-dissipation portion.

2. The heat dissipation device as claimed in claim 1, wherein the first heat dissipation unit defines bores therein, the positioning elements being extended through the bores and top end portions of the positioning elements being secured in the bores.

3. The heat dissipation device as claimed in claim 1, wherein each of the positioning elements comprises a post and a nut engaging with the post and the nut exerts a spring force on the first heat dissipation unit to make the first heat dissipation unit tightly attached on the side of the power adapter.

4. The heat dissipation device as claimed in claim 3, wherein the first heat dissipation unit defines four bores at four corners therein, the posts being extended through the bores and the nuts being secured in the bores.

5. The heat dissipation device as claimed in claim 2, wherein the second heat dissipation unit defines a plurality recesses into which bottom ends of the positioning elements are screwed.

6. The heat dissipation device as claimed in claim 3, wherein each post defines screw threads in a circumference of a top thereof, the top of the post being screwed with the nut.

7. The heat dissipation device as claimed in claim 3, wherein each post defines screw threads in a circumference of a bottom thereof, the bottom of the post being screwed in a recess defined in the second heat dissipation unit.

8. The heat dissipation device as claimed in claim 3, further comprising a plurality of springs wrapped around the nuts.

9. The heat dissipation device as claimed in claim 1, wherein a thermal interface material is applied on an outer surface of the at least one heat pipe.

10. The heat dissipation device as claimed in claim 1, wherein the first and second heat-dissipation portions of the first heat dissipation unit each define a slot to cooperatively form a passage for accepting a segment of the at least one heat pipe therein.

11. The heat dissipation device as claimed in claim 10, wherein the second heat dissipation unit comprises first and second heat-dissipation portions and the at least one heat pipe is partly sandwiched between the first heat-dissipation portion and the second heat-dissipation portion.

12. The heat dissipation device as claimed in claim 11, wherein the first and second heat-dissipation portions of the second heat dissipation unit each define a groove to cooperatively form a passage for accepting another segment of the at least one heat pipe therein.

13. The heat dissipation device as claimed in claim 1, wherein the at least one heat pipe is U-shaped.

14. The heat dissipation device as claimed in claim 1, wherein the first and second heat dissipation units are parallel to each other.

15. A heat dissipation device adapted for cooling a power adapter for supplying power to an electronic device, comprising:
a first heat dissipation unit adapted for contacting with a first surface of the power adapter;
a second heat dissipation unit adapted for contacting with a second surface of the powder adapter, wherein the second surface is opposite to the first surface;
a heat pipe thermally connecting the first and second heat dissipation units; and
a plurality of positioning elements each having a post for extending through the first heat dissipation unit with a bottom end of the post being fixed to the second heat dissipation unit, and a locking member securing a top end of the post to the first heat dissipation unit wherein the first heat dissipation unit comprises first and second heat-dissipation portions and the at least one heat pipe is partly sandwiched between the first heat-dissipation portion and the second heat-dissipation portion.

16. The heat dissipation device as claimed in claim 15, wherein the locking member exerts a spring force on the first heat dissipation unit toward the second heat dissipation unit.

* * * * *